(12) United States Patent
Yassine et al.

(10) Patent No.: US 6,465,266 B1
(45) Date of Patent: Oct. 15, 2002

(54) SEMICONDUCTOR DEVICE SHORT ANALYSIS

(75) Inventors: Abdullah Mohamad Yassine; Kola Olasupo, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 56 days.

(21) Appl. No.: 09/755,014

(22) Filed: Jan. 5, 2001

(51) Int. Cl.[7] ............................ H01L 21/66; G01R 31/26
(52) U.S. Cl. ............................................ 438/17; 438/10
(58) Field of Search ...................................... 438/10, 17

Primary Examiner—Long Pham
Assistant Examiner—Scott A Brairton

(57) ABSTRACT

Semiconductor device analysis is improved through the distinguishing of gate oxide failures from other non-oxide failures. According to an example embodiment of the present invention, oxide failures are distinguished from non-oxide shorts between a gate and source/drain region in a semiconductor device during gate oxide analysis. An electrical characteristic that exhibits a first response to an oxide failure and a second response to a non-oxide failure is detected and used to detect the nature of a short in the device. This analysis is easily incorporated into other tests, such as the Voltage Ramp Dielectric Breakdown test (VRDB), and is particularly useful for improving the ability to detect and analyze defects without necessarily viewing the defect or destroying the device.

20 Claims, 6 Drawing Sheets

SEMICONDUCTOR DEVICE SHORT ANALYSIS

FIELD OF THE INVENTION

The present invention relates generally to analysis of integrated circuit (IC) devices and, more particularly, to defect detecting of shorts in IC dies.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. These technological advances have fueled an increased demand for semiconductor devices and products that employ semiconductor devices. A byproduct of this increased demand has been a need to manufacture semiconductor devices in an efficient manner as considerations including device speed, reliability and affordability become increasingly important. In order to meet these and other needs, analyzing dies for functional defects has become increasingly valuable.

One type of defect that presents challenges to semiconductor device design and analysis is a defect that includes a short circuit. Circuit elements such as source/drain elements, gates, interconnects and various other elements can exhibit shorts between one another as a result of design and/or manufacturing problems. These shorts are often difficult to detect and to pinpoint. For example, a silicide short between a gate and a source/drain region is difficult to distinguish from a short resulting from a gate oxide defect. Identifying the nature of the short often requires that the defect be visually detected. At times, such analysis even requires that the die be destroyed or otherwise damaged, making it difficult or impossible to perform further analysis on the die, or to use the die in any capacity.

The difficulty in differentiating between non-oxide and oxide-related shorts makes analysis and design of semiconductor devices difficult and thus is a hindrance to the advancement of semiconductors and related technologies.

SUMMARY OF THE INVENTION

The present invention is directed to the detection and differentiation of defects in semiconductor devices, and is exemplified in a number of implementations and applications, some of which are summarized below.

According to an example embodiment of the present invention, a semiconductor die having gate, source/drain and well regions is analyzed. The die is susceptible to a short attributable to at least one of a gate oxide short and a source/drain silicide short. The die is stimulated, and an electrical response of the die to the stimulation is detected. The response includes an electrical characteristic of the die that exhibits a first response if the short is a gate oxide short, and exhibits a second response if the short is a non-oxide short. The stimulation may, for example, be selected to cause a particular failure or short in the device. When the detected response exhibits the first response, a gate oxide short is detected, and when the detected response exhibits the second response, a non-oxide short is detected. In this manner, the detection and identification of failures in semiconductor devices is improved because the electrical characteristic provides a differentiation between oxide and non-oxide shorts, addressing challenges including those discussed in the Background hereinabove.

According to another example embodiment of the present invention, a system is adapted for analyzing a semiconductor die having gate, source/drain and well regions. The die is susceptible to an electrical short attributable to at least one of a gate oxide short and a non-oxide short. The system includes an electrical testing arrangement adapted to stimulate the die. A response from the stimulated die is detected by a test circuit adapted to detect a response including an electrical characteristic that exhibits a first response if the short is a gate oxide short and exhibits a second response if the short is a non-oxide short. A comparison device is adapted to detect whether or not the short is a gate oxide short in response to the electrical characteristic.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
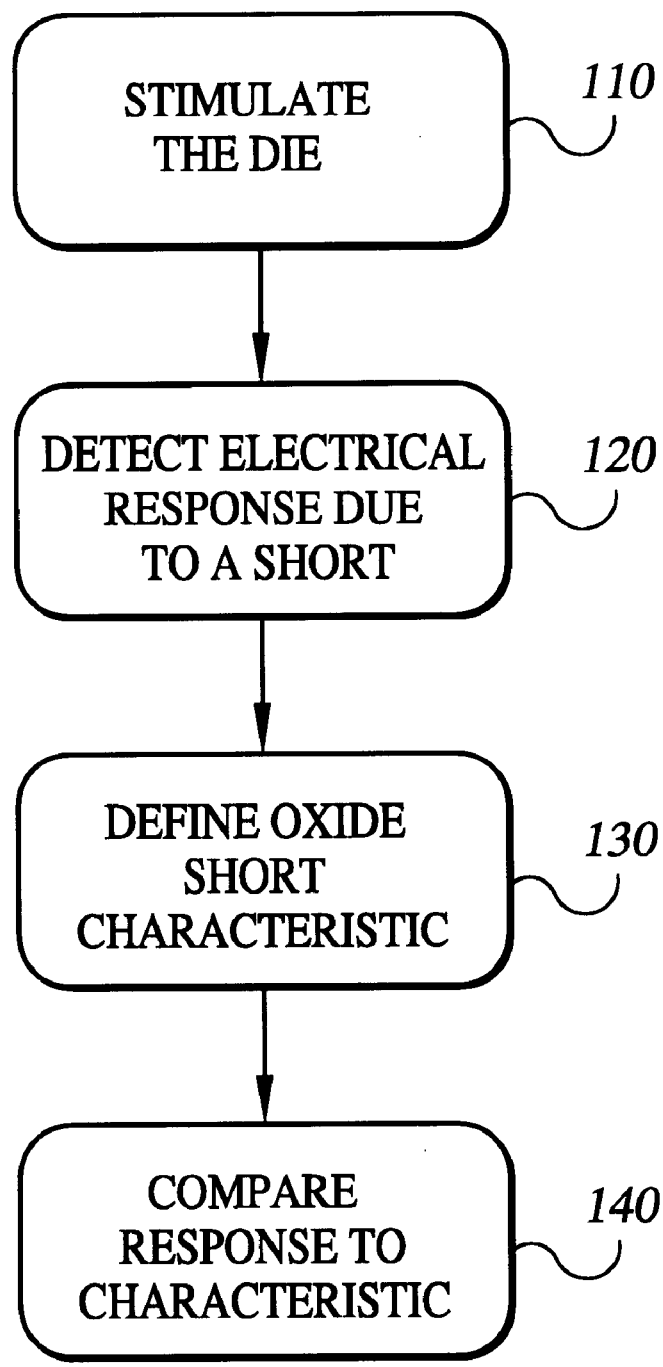
FIG. 1 is a flow diagram for analyzing a semiconductor device, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for devices exhibiting gate to source/drain region shorts. While the present invention is not necessarily limited to such applications, various aspects of the invention may be appreciated through a discussion of various examples using this context.

According to an example embodiment of the present invention, it has been discovered that shorts between a gate and a source/drain region in a semiconductor device can be differentiated as being the result of an oxide breakdown or a non-oxide breakdown. The differentiation is achieved using an electrical characteristic that responds in a first manner to a short at the gate oxide, and in a second manner to a non-oxide short, such as a silicide short between the gate and a source/drain region. An electrical stimulus is applied to the die and an electrical characteristic of the die is detected. The electrical characteristic is used to determine whether or not the first or second response is present, and the nature of the short is detected therefrom.

The ability to determine the cause of a short as being either a gate oxide defect-related short or a silicide short improves the ability to design, test and analyze semiconductor dies. Moreover, the ability to perform such analysis without necessarily accessing a defective region to make a visual analysis is particularly beneficial because the analysis can be performed without necessarily harming the device. These improvements are particularly useful because gate oxide plays an important role in the reliability of MOS devices, and is a focal point in the qualification of new technologies.

FIG. 1 is a flow diagram for analyzing a semiconductor die, according to an example embodiment of the present invention. At block 110, a semiconductor die is stimulated. A tester detects an electrical response of the die that includes an electrical characteristic that is affected differently by oxide and non-oxide shorts. At block 120, a response due to a short is detected. A characteristic of the response that is indicative of the short being an oxide short is defined at block 130, and the detected response is compared to the characteristic at block 140 and used to detect whether the response is due to an oxide failure or a non-oxide failure.

In a more particular example embodiment of the present invention, gate oxide failures are distinguished from silicide shorts between gate and source/drain regions in a semiconductor device during a gate oxide test at low voltage. The gate oxide test may, for example, be included in a type of device test called Voltage, Ramp Dielectric Breakdown test (VRDB) that is used for analyzing a semiconductor die, wherein the device is stressed using a ramped voltage until the oxide fails. The device fails when its leakage current (gate current) exceeds a preset gate current criterion at a monitoring voltage. Failed devices are categorized into modes, including a mode A category, according to the maximum breakdown voltage. Mode A represents failures at a gate voltage that corresponds to an oxide field of less than or equal to about 1.0 MV/cm. Mode A failures can be due, for example, to gross gate oxide defects or non-oxide processing defects such as silicide shorts between the gate and source/drain (S/D). Both defects cause high gate current and are detected at very low gate voltage (Vg), and generally at a Vg of less than about $|1.0|$ V. Existing VRDB tests cannot differentiate between gross oxide defects and non-oxide defects. Therefore, these defects had been reported as an oxide failure in the VRDB test whether they are a result of an oxide or non-oxide defect.

In this example embodiment, PMOS and NMOS capacitors with gate (G), drain (D) and well (W) terminals are tested using an analysis device, such as the HP 4155 Parameter Analyzer available from Hewlett-Packard of Palo Alto, Calif. The devices are tested in accumulation, wherein Vg<0.0 for NMOS and Vg>0.0 for PMOS capacitors. The drain and well are grounded through separate SMUs (source/measure units) and currents flowing in each terminal are monitored as the gate voltage is swept from 0.0 to Vg.

Figure 2A:
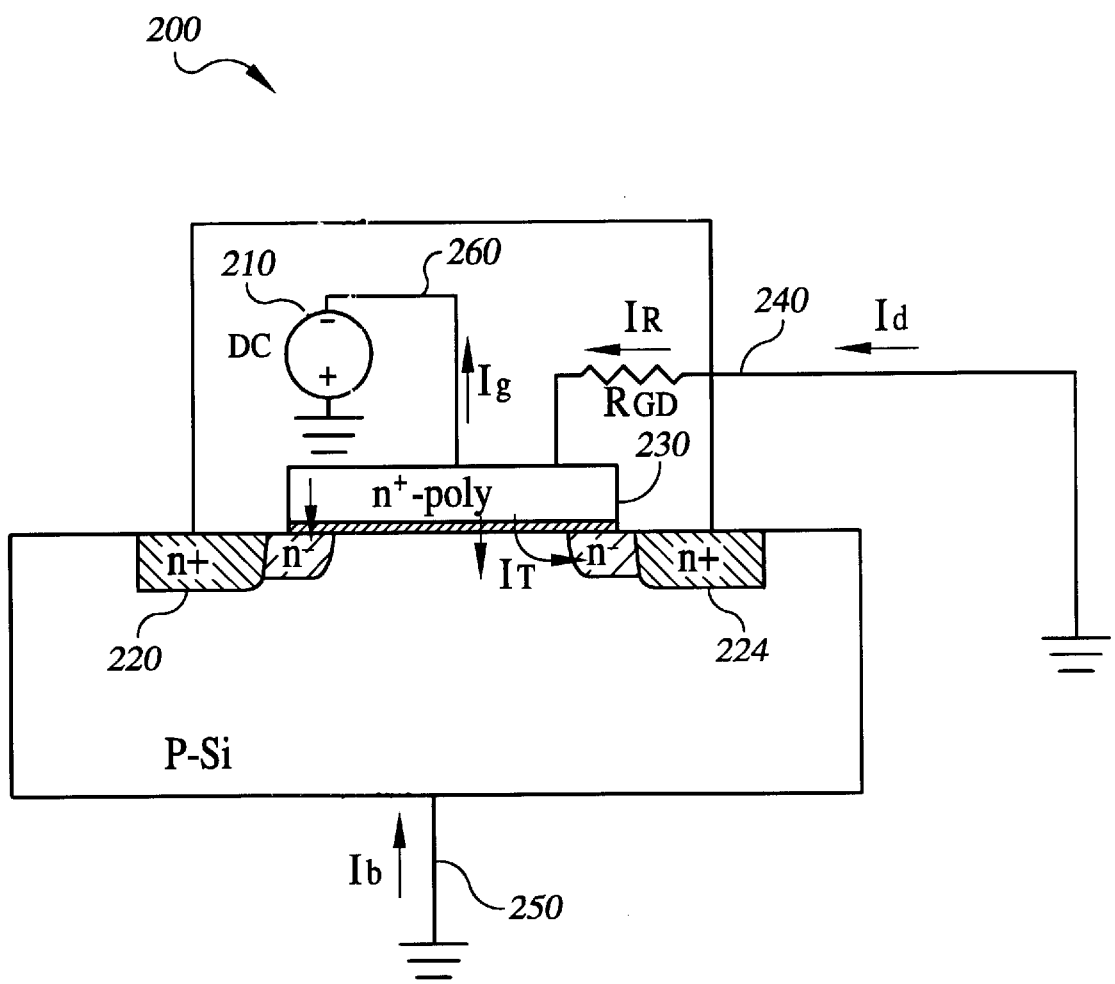
FIG. 2A is a test diagram adapted for a device having a gate-to-drain silicide short, according to another example embodiment of the present invention.

FIG. 2A shows an example testing arrangement 200 for analyzing a device using a gate-to-drain short shown as $R_{GD}$. The device includes a transistor having source/drain regions 220 and 224, and gate region 230. A power supply 210 is coupled to and adapted to power the device via gate test circuitry 260 having gate current shown as Ig. Source/drain test circuitry 240 is coupled to each of the source drain regions 220 and 224 and to the gate via the gate-drain short $R_{GD}$ having current $I_R$. The drain current Id is shown leading from the short and each of the source/drain regions. Test circuitry 250 for the well region is shown coupled to the well region of the device, and well current Ib can be detected therefrom.

Figure 2B:
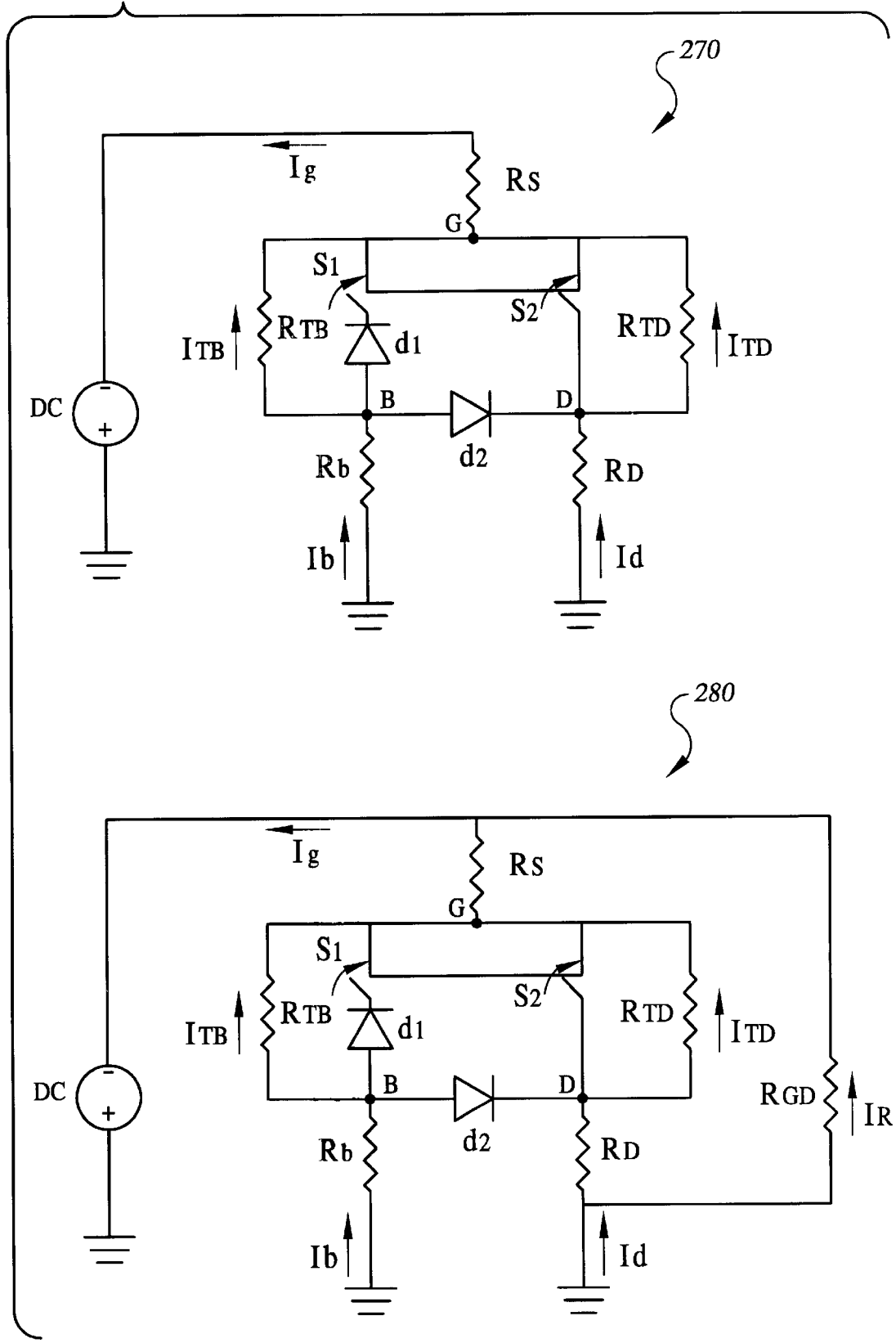
FIG. 2B is an equivalent circuit adapted for determining electrical characteristics of a short in a semiconductor device exhibiting gate oxide breakdown, according to another example embodiment of the present invention.

The components of the leakage current and their characteristics are used to detect mode-A failures at very low voltage (e.g., $Vg \leq |1.0|$ V), and are useful for detecting gross gate oxide defects or non-oxide defects via dc equivalent circuit analysis of the MOS device under dc bias. FIG. 2B shows a simplified dc equivalent circuit diagram 270 for a normal NMOS device, and diagram 280 for a device such as shown in FIG. 2A with gate-to-drain silicide short ($R_{GD}$) under stress. The diode d1, the switch S1 and the parallel resistance $R_{TB}$ represent the dc path between the cathode and the anode of the capacitor $C_{GB}$ (capacitance between the gate and the well). The diode d2 is the diode between the well and the drain. The switch S2 and the parallel resistance $R_{TD}$ represent a dc path between the cathode and the anode of the capacitor $C_{GD}$ (capacitance between the gate and the LDD). S1 and S2 are open under normal conditions and close when the gate oxide breaks down. $R_{TD}$ and $R_{TB}$ represent a tunneling path through the gate oxide between the gate and the drain and the well respectively. Diode d1 is formed between the poly gate and the well after oxide breakdown in the channel area.

For a normal device under bias as represented in circuit 270, the gate current, Ig, the drain current, Id and the well current, Ib are due to the tunneling current through the gate oxide. In this case, the gate current is given by:

$$Ig=Ib+Id \qquad (1)$$

$$Id=I_{TD}$$

$$Ib=I_{TB}$$

Where $I_{TD}$ and $I_{TB}$ are respectively the drain and the well currents due to electron tunneling through the oxide.

If a path ($R_{GD}$) exists between the gate and the drain due to a silicide short, as represented in FIG. 2A and in circuit 280 of FIG. 2B, the gate current is given at low voltage (e.g., diode d2 is off) by:

$$Ig=Ib+Id \qquad (2)$$

$$Id=I_{TD}+I_R$$

$$Ib=I_{TB}$$

$$I_R=Vg/R_{GD}$$

or $$Ig=I_{TB}+I_{TD}+Vg/R_{GD} \qquad (3)$$

Equations (1) and (3) are compared to show that for a non-defective gate oxide, a silicide short between the gate and the drain results in Ig and Id being determined by the value of $R_{GD}$, and Ib is independent of $R_{GD}$.

The device is operated while monitoring the circuits in FIG. 2B. If the oxide breaks down at the G/D overlap, S2 in FIG. 2B closes. If Vg has a value that is not enough to turn on diode d2, the well current, Ib is due to a tunneling component and the forward-biased current of the diode d2. Also, the gate current is given by:

$$Ig \cong \frac{Vg}{Rs + R_D} = Id \quad (4)$$

Vg is increased until the diode d2 is turned on, and the currents in the device are given by:

$$Ig = \frac{(R_D + R_{d2} + R_b)Vg - R_D V_D}{Rs(R_D + R_{d2} + R_b) + R_D(R_{d2} + R_b)} \quad (5)$$

and $$Id = \frac{(R_{d2} + R_b)Vg - Rs V_D}{Rs(R_D + R_{d2} + R_b) + R_D(R_{d2} + R_b)} \quad (6)$$

and $$Ib = \frac{R_D Vg - (R_D + Rs)V_D}{Rs(R_D + R_{d2} + R_b) + R_D(R_{d2} + R_b)} \quad (7)$$

where $V_D$ and $R_{d2}$ are the turn on voltage and the on-resistance, respectively, of the diode d2.

If the oxide breaks down in the gate/well area, the switch S1 closes; therefore, a common-base npn transistor is formed between drain (collector), well (base) and gate (emitter). Since Vg is negative with respect to Vd and Vb, the diode d1 (emitter-base diode) is forward-biased and the collector-base terminals are at the same potential, and the currents in the NMOS (in FIG. 2) are approximated by:

$$Ig = I_E = -I_{Es}(e^{(q \backslash V_{GB} \backslash kT)} - 1) \quad (8)$$

and $$Id = Ic = \alpha_F I_{Es}(e^{(q \backslash V_{GB} \backslash kT)} - 1) \quad (8)$$

and $$Ib = -(1 - \alpha_F)Ig = Id / \beta_F \quad (9)$$

and $$\beta_F = \frac{\alpha_F}{1 - \alpha_F}$$

where $\alpha_F$ is the common-base forward short-circuit current gain and $\beta_F$ is the common-emitter forward short-circuit current gain. $V_{GB}$ is negative for the NMOS and $I_{ES}$ is the reverse saturation current of the common-base junction. The npn current gain depends on the location of the oxide breakdown area (e.g., it determines the width of the base).

In addition to the application of NMOS devices, the above analysis is applicable to a variety of devices including PMOS devices, and a similar current equation can be obtained with selected voltage and current polarities. In particular, for different devices and oxide thickness down to 18 Å, Ib is set at 1.0 nA when Vg=|1.0V| as a sorting criteria for silicide shorts along with Ig failure limit. For oxide thickness below 18 Å, the Ib limit is adjusted to provide an easily detectable response and/or change in response that can be used to detect the nature of the failure.

The above analysis is used to determine the cause of an electrical short in the device. In one implementation, an oxide-related short is detected as the post oxide-breakdown well-current, Ib, being higher than Ib measured in the case of gate-to-drain silicide short. A comparison may be done, for example, between a reference device known to not exhibit an oxide defect and the device being tested. If Ib in the device under test (DUT) is higher than the Ib in the reference device, the short is identified as an oxide short. In another implementation, an oxide-related short is detected as the rate of increase of Ib being higher at Vg≦|1.0V| than the rate of increase when a short exists between the gate and source/drain. The rate of increase can also be detected using a reference device, and the device being tested be compared thereto. In either implementation, the well current Ib is used to differentiate between failures due to silicide shorts and those due to gate oxide defects at low voltage when the tester detects a mode A failure.

Figure 3:
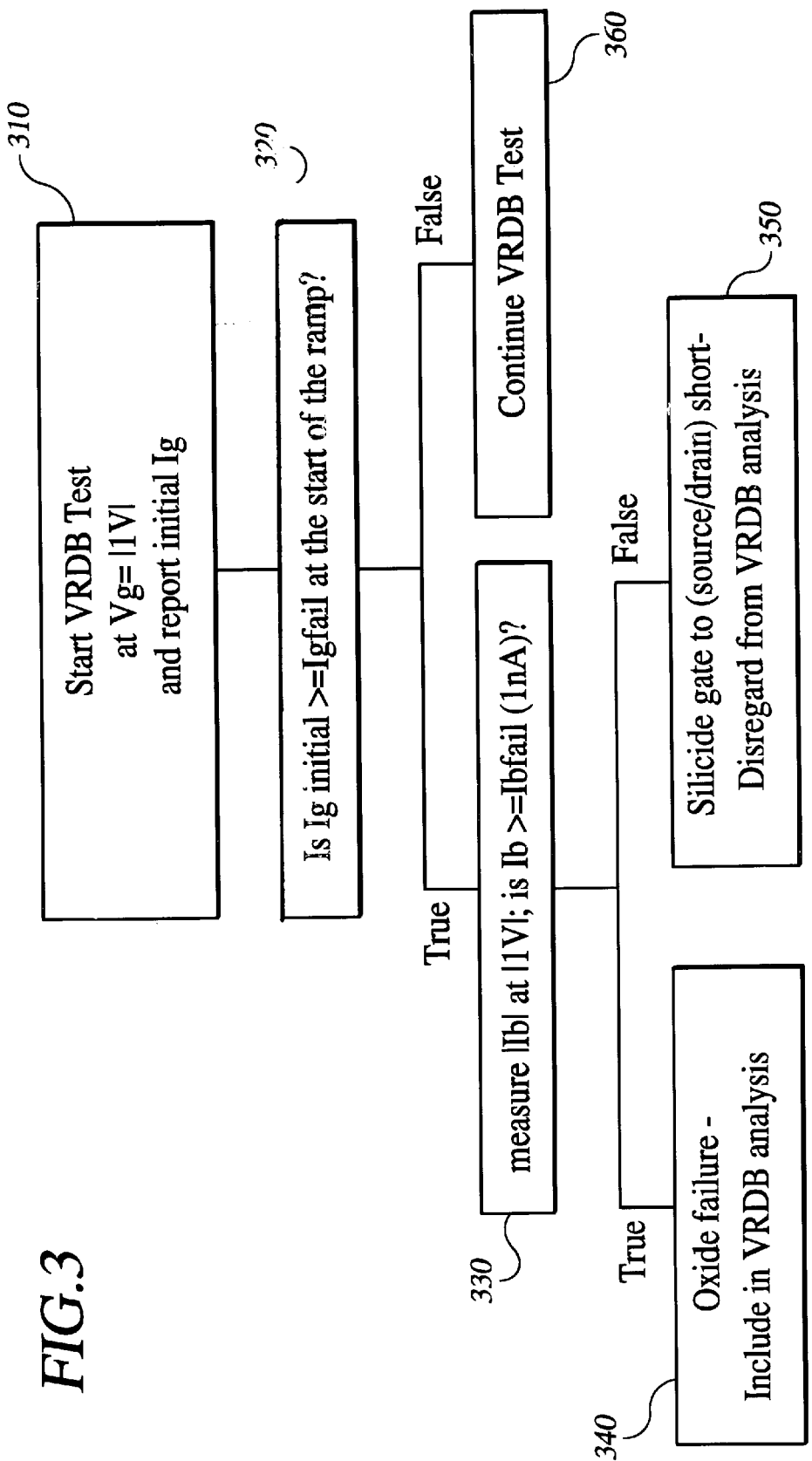
FIG. 3 is a flow diagram for analyzing a semiconductor device, according to another example embodiment of the present invention.

FIG. 3 is a chart showing the implementation of the use of the well current to detect and identify the nature of a short, according to an example embodiment of the present invention. At block 310, a VRDB test is started with Vg having a voltage of about |1.0V|, and the initial Ig is detected. If the detected initial Ig is not greater than or equal to the failure gate current $Ig_{fail}$ at block 320, the VRDB test is continued at block 360. If the detected initial Ig is greater or equal to $Ig_{fail}$ at block 320, |Ib| is measured at |1.0V| to determine whether Ib is greater or equal to $Ib_{fail}$ (e.g., 1.0 nA) at block 330. If Ib is greater than or equal to $Ib_{fail}$ at block 330, an oxide failure is detected at block 340, and is included in the VRDB analysis as an oxide failure. If Ib is not greater or equal to $Ib_{fail}$ at block 330, a silicide gate to source/drain short is detected, and the short is disregarded from the VRDB analysis.

Figure 4:
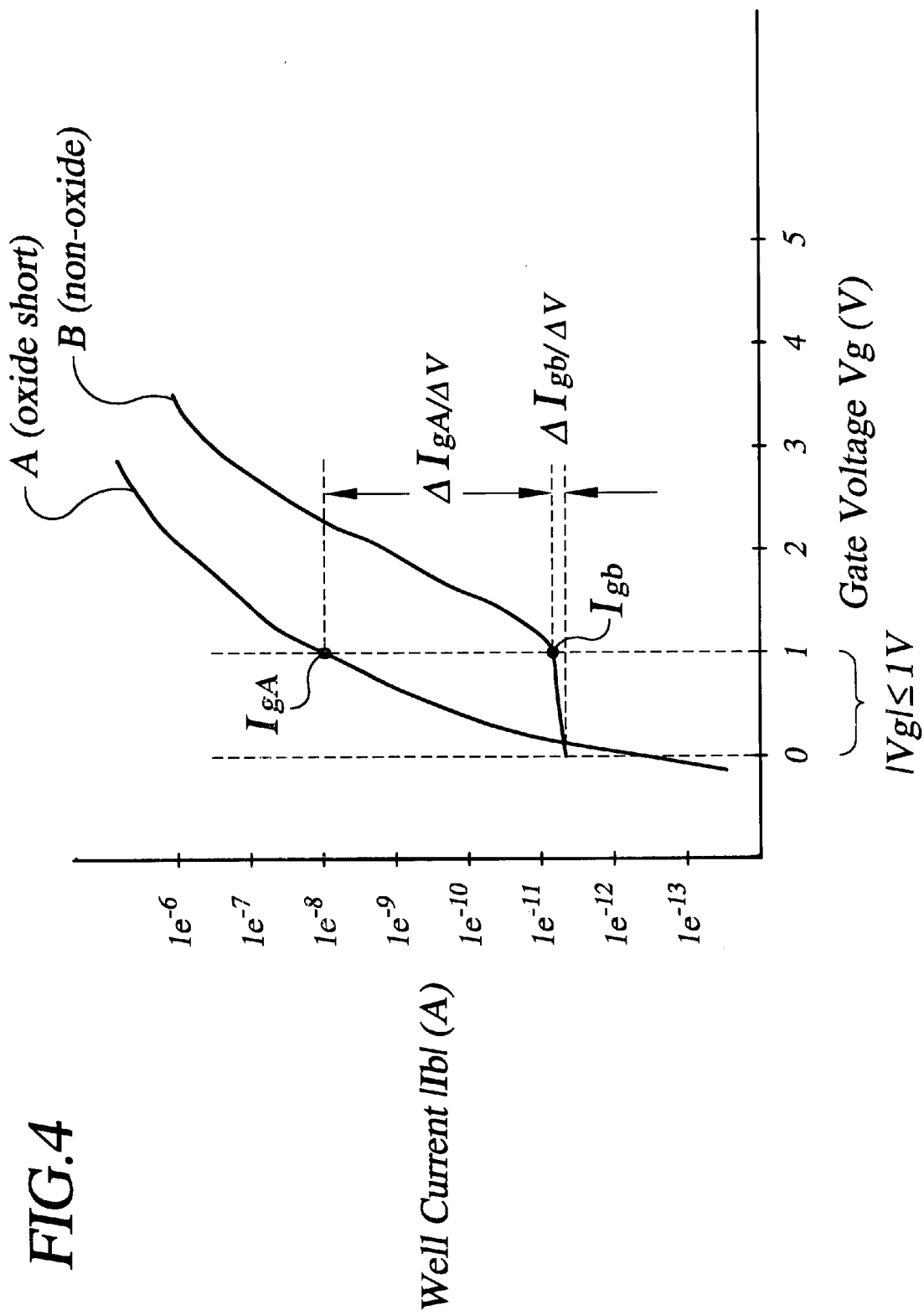
FIG. 4 is an example graph for analyzing a semiconductor device, according to another example embodiment of the present invention.

FIG. 4 is a plot showing well current Ib versus gate voltage Vg that is used to determine the nature of a failure in a semiconductor device, according to another example embodiment of the present invention. Two curves A and B are shown for an example oxide-based short and an example non-oxide-based short, respectively. The well current Ib of a semiconductor device being analyzed is detected, plotted versus gate voltage Vg, and is compared to FIG. 4. In one implementation, the gate current Ig at a voltage of about Vg=1.0 is detected. When the detected well current is representative of $Ig_A$, the short is determined to be an oxide short, and when the detected well current is representative of $Ig_B$, the short is determined to be a non-oxide short. In another implementation, the rate of change of the well current Ib is detected over the range of between about 0.0V and 1.0V. When the change in gate current (ΔIg) over the change in gate voltage (ΔVg) is representative of $\Delta Ig_A / \Delta V$ (e.g., about $1.0\ e^{-8}$), the short is determined to be an oxide-based short. When the value of ΔIg/ΔV of the device being tested is closer to of $\Delta Ig_B / \Delta V$ (e.g., about $1.0\ e^{-11}$), the short is determined to be a non-oxide short.

In a more particular example embodiment of the present invention, the curves A and B are created using one or more test devices having a simulated short. In one implementation, a non-defective die is coupled to an electrical test circuit having a resistor, wherein the resistor is coupled between a gate and drain and simulates a silicide short. An electrical response of the die is detected and the result is plotted as the non-oxide based short. When a defective die is analyzed, it is compared to the response of the reference die having the simulated short. When the response of the defective die includes a well current or change of well current that is greater than the response of the non-defective die with the simulated silicide short, an oxide-based short is detected.

In another example embodiment of the present invention, a threshold electrical characteristic is defined and used to compare to a detected electrical characteristic of a DUT. The threshold is defined as a function of the die having a short resulting from an oxide-based defect. In one implementation, the threshold is defined as a value of the well current of a transistor, such as Ib of FIGS. 2A and 2B. When the detected electrical characteristic is indicative of Ib being greater than the defined threshold, a detected short is determined to be an oxide-based short, and if Ib is less than the threshold, the short is a non-oxide based short. In the case of FIG. 4, a threshold Ib of about 1.0 nA at a gate voltage of about 1.0V is sufficient to detect an oxide-based short.

In another implementation, the threshold is defined as a rate of change of the well current of the transistor, such as Ib of FIGS. 2A and 2B. In this instance, the rate of change of the current is detected over a selected gate voltage range. When the detected electrical characteristic is indicative of the rate of change being above the selected threshold, a detected short is determined to be an oxide-based short. When the detected characteristic is indicative of a rate of change being less than the threshold, the short is a non-oxide-based short. Referring again to FIG. 4, a rate of change over the range of between about 0.0 and 1.0V being greater than about 1.0 nA/V is indicative of an oxide-based short.

Figure 5:
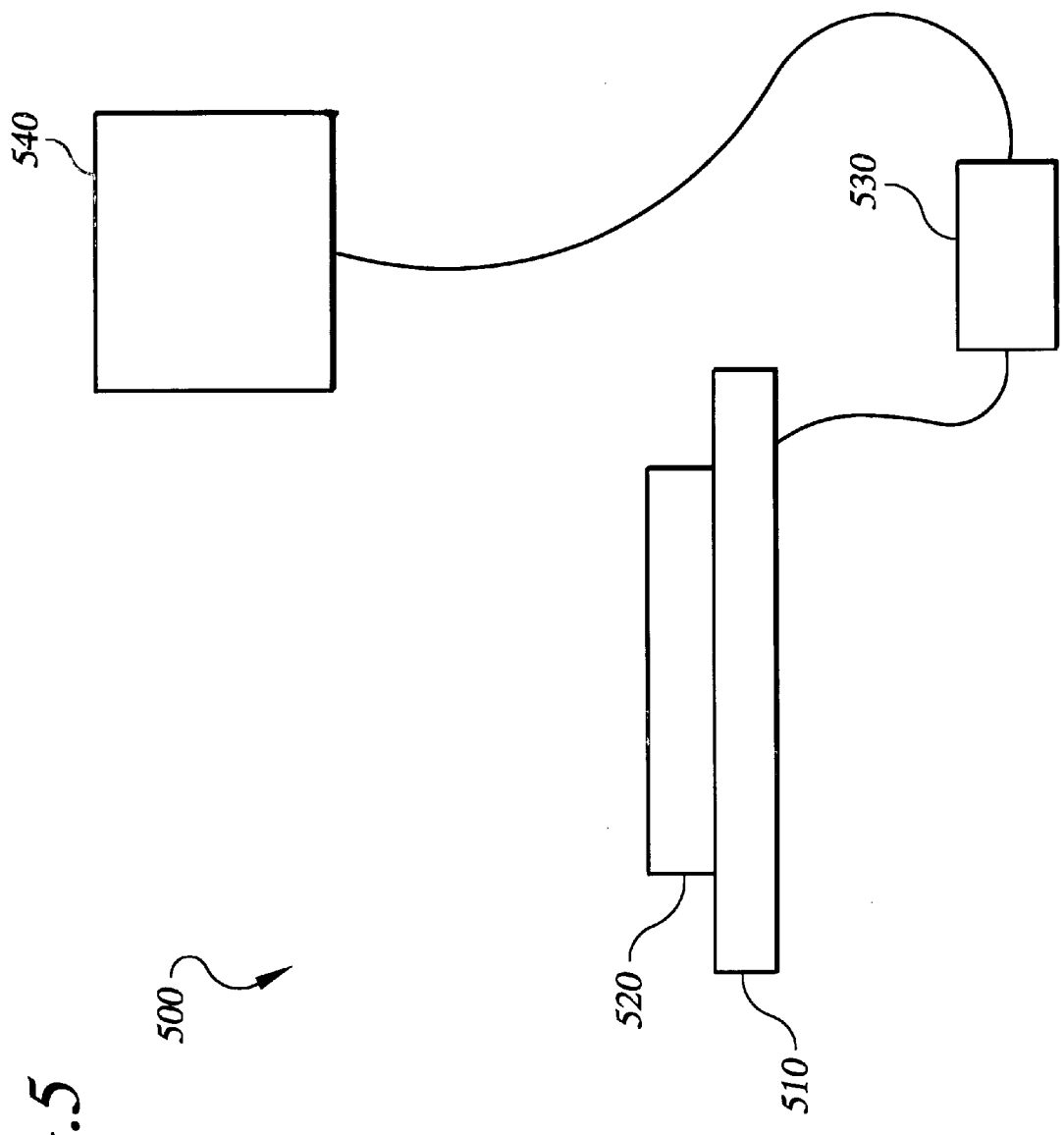
FIG. 5 is system for analyzing a semiconductor device, according to another example embodiment of the present invention.

In still another example embodiment of the present invention, FIG. 5 shows a system 500 adapted to analyze a semiconductor device and to detect the nature of a short. The system includes a testing arrangement 530 adapted to electrically couple to a semiconductor die 520 via a package substrate 510 and to stimulate the die. The testing arrangement 530 is also adapted to detect a response from the die, such as a well current, that exhibits a first response if a gate oxide short is present, and exhibits a second response when a non-oxide short is present. A comparison device 540, such as a computer, is adapted to detect whether or not the short is a gate oxide short in response to the detected response. In one implementation, the comparison device 540 is adapted to display well current versus gate voltage in a graph, such as shown in FIG. 4. The graph is then used to detect the nature of the short.

In a more particular example embodiment of the present invention, the comparison device 540 is programmed to automatically determine whether the short is an oxide or non-oxide short using the detected response. In this instance, the device 540 is programmed to detect one or both of the value of the well current and the rate change in value of the well current to a threshold value for each. When the value or rate of change exceeds the respective programmed threshold, the short is determined to be an oxide-related failure, and a value less than the programmed threshold is determined to be a non-oxide related failure, such as a silicide gate to source/drain short.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having gate, source/drain and well regions, the die being susceptible to an electrical short attributable to at least one of a gate oxide short and a non-oxide short, the method comprising:

stimulating the die;

detecting a response of the die, the response including an electrical characteristic that exhibits a first response if the short is a gate oxide short, and exhibits a second response if the short is a non-oxide short; and detecting whether or not the short is a gate oxide short in response to the of electrical characteristic.

2. The method of claim 1, wherein stimulating the die includes performing a voltage ramp dielectric breakdown test.

3. The method of claim 1, wherein detecting an electrical characteristic includes detecting a characteristic representing the response of an equivalent circuit to a short between gate oxide and a source/drain region.

4. The method of claim 1, wherein detecting a response includes detecting at least one of: a gate current, a source/drain current and a well current.

5. The method of claim 4, wherein detecting the response includes detecting a change in the detected response and comparing the detected change to a known change for a die exhibiting a short.

6. The method of claim 5, wherein detecting a change in the response includes detecting a change in the well current.

7. The method of claim 6, wherein detecting a change in the well current includes detecting that the well current is greater than a threshold defined as a function of the well current.

8. The method of claim 7, further comprising defining the threshold as the well current at a gate current of about 1.0V under oxide failure.

9. The method of claim 6, wherein detecting a response of the die includes detecting a rate of change of the well current, the rate of change corresponding to an oxide short being greater than the rate of change corresponding to a non-oxide short at a gate voltage of between about 0.0V and 1.0V, wherein detecting a response includes detecting the rate of change of the well current, and wherein detecting whether or not the short is a gate oxide short includes detecting whether or not the rate of change is higher than a threshold rate of change, the threshold rate of change being defined as the rate of change that corresponds to a short being an oxide short.

10. The method of claim 5, wherein detecting the response includes detecting that the short is a gate oxide short in response to a common-base n-p-n transistor being formed between the drain, well and gate as a result of the short.

11. The method of claim 1, further comprising:

connecting a resistor between a gate and drain in a non-defective die having the same design as the die being analyzed;

detecting an electrical response of the non-defective die in response to the simulated silicide short; and wherein detecting the cause of the short includes comparing the response to the detected response of the non-defective die.

12. The method of claim 1, further comprising forming separate gate, source/drain and well terminals in the die, wherein detecting a response of the die includes detecting a response from at least one of the gate, source/drain and well terminals.

13. The method of claim 1, wherein stimulating the die includes operating the gate at a voltage of about less than about |1.0| V.

14. The method of claim 13, wherein the gate oxide is operated at an electric field of less than about 1.0 MV/cm.

15. The method of claim 1, wherein detecting that the short is one of a gate oxide short or a drain/silicide short does not include visual analysis of the die.

16. The method of claim 1, wherein the die is attached to a package substrate, and wherein detecting an electrical response of the die includes detecting a response via the package substrate.

17. The method of claim 1, wherein detecting an electrical characteristic includes defining an electrical equation that exhibits a first result if the short is a gate oxide short, and exhibits a second result if the short is a non-oxide short.

18. The method of claim 1, wherein stimulating the die includes using electrical signals that cause a short in the die.

19. A system for analyzing a semiconductor die having gate, source/drain and well regions, the die being susceptible to an electrical short attributable to at least one of a gate oxide short and a non-oxide short, the system comprising:

means for stimulating the die;

means for detecting a response of the die, the response including an electrical characteristic that exhibits a first response if the short is a gate oxide short, and exhibits a second response if the short is a non-oxide short; and means for detecting whether or not the short is a gate oxide short in response to the detected electrical characteristic.

20. A system for analyzing a semiconductor die having gate, source/drain and well regions, the die being susceptible to an electrical short attributable to at least one of a gate oxide short and a non-oxide short, the system comprising:

an electrical testing arrangement adapted to stimulate the die;

a test circuit adapted to detect a response of the die, the response including an electrical characteristic that exhibits a first response if the short is a gate oxide short, and exhibits a second response if the short is a non-oxide short; and a comparison device adapted to detect whether or not the short is a gate oxide short in response to the detected electrical characteristic.

* * * * *